United States Patent
Ramm et al.

(10) Patent No.: US 10,106,881 B2
(45) Date of Patent: Oct. 23, 2018

(54) COATING COMPRISING A MO-N-BASED LAYER IN WHICH THE MOLYBDENUM NITRIDE IS PROVIDED AS A DELTA PHASE

(71) Applicant: Oerlikon Surface Solutions AG, Pfaffikon, Pfaffikon (CH)

(72) Inventors: Jurgen Ramm, Maienfeld (CH); Johann Karner, Triesen (LI)

(73) Assignee: OERLIKON SURFACE SOLUTIONS AG, PFÄFFIKON, Pfäffikon SZ (CH)

(*) Notice: Subject to any disclaimer, the term of this patent is extended or adjusted under 35 U.S.C. 154(b) by 165 days.

(21) Appl. No.: 15/039,591

(22) PCT Filed: Dec. 1, 2014

(86) PCT No.: PCT/EP2014/003200
§ 371 (c)(1),
(2) Date: May 26, 2016

(87) PCT Pub. No.: WO2015/096882
PCT Pub. Date: Jul. 2, 2015

(65) Prior Publication Data
US 2017/0029930 A1    Feb. 2, 2017

(30) Foreign Application Priority Data

Nov. 29, 2013  (DE) .................. 10 2013 018 007
Nov. 26, 2014  (EP) .................. PCT/EP2014/003151

(51) Int. Cl.
C23C 14/06    (2006.01)
C23C 14/32    (2006.01)

(52) U.S. Cl.
CPC ........ C23C 14/0641 (2013.01); C23C 14/325 (2013.01)

(58) Field of Classification Search
USPC ....... 106/286.1, 286.8; 428/698; 204/192.15, 204/192.16
See application file for complete search history.

(56) References Cited

U.S. PATENT DOCUMENTS 6,617,057 B2 *  9/2003  Gorokhovsky ....... C23C 14/022
                                                    428/698
2009/0026292 A1 *  1/2009  Davies ................. F02M 57/023
                                                    428/698

(Continued)

FOREIGN PATENT DOCUMENTS

DE   10 2010 053 751 A1   5/2012
DE   10 2012 207 814 A1   11/2013

OTHER PUBLICATIONS

Hazar "Characterization of MoN coatings for pistons in a diesel engine" Materials & Design 31 (2010) p. 624-627.*

(Continued)

*Primary Examiner* — Archene A Turner
(74) *Attorney, Agent, or Firm* — Pearne & Gordon LLP (57) ABSTRACT

A coating and a method for the production thereof. The coating includes at least one Mo—N-based layer of hard material which at least predominantly contains the hexagonal phase of the molybdenum nitride δ-MoN. The intensity ratio of the two peaks (δ-MoN 220)/(δ-MoN 200) are ≥3, preferably ≥10, especially preferably ≥30.

20 Claims, 8 Drawing Sheets (56) References Cited

U.S. PATENT DOCUMENTS

2013/0303414 A1    11/2013  Ramm
2015/0011444 A1*   1/2015   Ramm ................ C23C 14/0676
                                                          204/192.16

OTHER PUBLICATIONS

Urgen et al "Characterization of molybdenum nitride coatings produced by arc-PVD technique" Surface and Coatings Technology 94-95 (1997) p. 501-506.*

Sarioglu, et al., "Measurement of Residual Stresses by X-ray Diffraction Techniques in MoN and Mo2N Coatings Deposited by Arc PVD on High-speed Steel Substrate", Surface and Coatings Technology, Elsevier, Amsterdam, NL, Bd. 190, Nr. 2-3, Jan. 21, 2005.

Kazmanli, et al., "Effect of Nitrogen Pressure, Bias Voltage and Substrate Temperature on the Phase Structure of Mo-N Coatings Produced by Cathodic Arc PVD", Surface and Coatings Technology Elsevier, Switzerland, Bd. 167, Nr. 1, Apr. 1, 2003.

International Search Report for PCT/EP2014/003200 dated Jul. 27, 2015.

Written Opinion for PCT/EP2014/003200 dated Jul. 27, 2015.

Mirescu, C.R. and Capitanu, L.; "Surface Topography Characterization: A pragmatic approach," SISOM 2012 and Session of the Commission of Acoustics; available at http://www.imsar.ro/SISOM_Papers_2012/SISOM_2012_R_13.pdf, retrieved Apr. 11, 2018; pp. 240-254.

Romanian Academy, Department of Technical Sciences; "The Annual Symposium of the Institute of Solid Mechanics SISOM 2012 and Session of the Commission of Acoustics," Bucharest, Romania, May 30-31, 2012; available at http://www.imsar.ro/Sisom_2012.pdf, retrieved Apr. 11, 2018; 21 pages.

* cited by examiner

| Example No. | Substrate temperature [°C] | $N_2$ pressure [Pa] | Bias Voltage [V] | Predominantly present phase |
|---|---|---|---|---|
| 1 (inventive) | 200 +/- 15 | 1.5 | -20 | δ-MoN |
| 2 (inventive) | 200 +/- 15 | 3 | -20 | δ-MoN |
| 3 (inventive) | 200 +/- 15 | 3 | -120 | δ-MoN |
| 4 (comparative) | 300 +/- 15 | 3 | -20 | γ-$Mo_2N$ |
| 5 (comparative) | 400 +/- 15 | 1.5 | -20 | γ-$Mo_2N$ |
| 6 (comparative) | 400 +/- 15 | 3 | -40 | γ-$Mo_2N$ |
| For the examples 1 to 6 of this table, only nitrogen gas was added as working/reactive gas in the vacuum coating chamber | | | | |

Fig. 1

Nitrogen pressure* [Pa]
*The bias voltage for all processes in this table was -20V

COATING COMPRISING A MO-N-BASED LAYER IN WHICH THE MOLYBDENUM NITRIDE IS PROVIDED AS A DELTA PHASE

The present invention relates to a layer system comprising at least one molybdenum nitride layer, wherein the layer has the characteristic very good sliding properties of hexagonal molybdenum nitride, but at the same time an "appropriate" hardness, which is between 2600 HV and 3700 HV (Vickers hardness) or between 26-27 GPa and 37-38 GPa (indentation hardness $H_{IT}$).

The present invention also relates to a method for the surface treatment of components, wherein at least one surface of a component is coated according to the invention and preferably subsequently post-treated using a brushing method so that enhanced sliding properties as well as reduced wear and tear of the counter body are achieved in tribological applications.

STATE OF THE ART

The use of molybdenum nitride layers or molybdenum nitride-based layers for coating components is well known in the prior art.

Ramm for example discloses in DE102010053751 A1 that coating systems with a molybdenum nitride layer for coating components resp. sliding elements can be used. This document teaches that coating the component surfaces with a molybdenum nitride layer enables both the coefficient of friction against steel as well as steel-smearing on the coated component surfaces to be reduced. The XRD diffraction pattern in FIG. 4 of document DE102010053751A1 shows that the disclosed molybdenum nitride layers predominantly have a cubic structure, which refers to the gamma or zeta phase of molybdenum nitride. In addition, it is stated that these layers have a layer hardness of approx. 3000 HV and were deposited by means of a PVD arc process using molybdenum targets in a reactive atmosphere of nitrogen, with a coating temperature of 450° C., a nitrogen pressure of 3.5 Pa and a negative substrate bias voltage of −20 V were used. The friction coefficients were determined both for coated surfaces that were subsequently polished as well as for coated surfaces that were subjected to no post-treatment after the coating. Ramm in DE102010053751 A1 also suggests a further layer consisting of molybdenum monoxide or molybdenum oxinitride and which is used as the uppermost layer of the coating. It is further noted that the growth of various phases of molybdenum nitride can be well regulated by the adjustment of pulse parameters if the molybdenum nitride layer is deposited for example by means of pulsed spark evaporation and/or using a pulsed bias voltage.

Ürgen et al. report in *Surface and Coatings Technology* 94-95 (1997) 501-506 about molybdenum nitride layers which have been deposited by means of PVD arc evaporation of molybdenum targets in a reactive nitrogen atmosphere. Molybdenum nitride layers having different phases were produced by varying the nitrogen pressure, the coating temperature of between 450° C. and 500° C. being maintained and a negative substrate bias voltage of −50 V being used. Ürgen reports that the formation of the cubic gamma phase ($\gamma$-Mo$_2$N) of molybdenum nitride was enhanced by using a low nitrogen pressure of 0.4 Pa or 0.8 Pa and the formation of the hexagonal delta phase ($\delta$-MoN) of molybdenum nitride was enhanced by using a higher nitrogen pressure of 1.2 Pa or 1.8 Pa. The layers comprising $\gamma$-Mo$_2$N had hardness values of 30000 N/mm$^2$ to 36000 N/mm$^2$, while the layer comprising $\delta$-MoN had higher hardness values of approximately 38000 N/mm$^2$ and higher. Tribological tests with subsequently polished molybdenum nitride layers showed that molybdenum nitride layers with higher nitrogen content have better wear properties, lower friction coefficients and a decreased tendency to form cracks.

Maier proposes in DE102012207814A1 to coat components, in particular sliding elements, with a protective coating which has a main layer whose main components are molybdenum and nitrogen, wherein preferably the main layer is to be formed as a molybdenum nitride layer, the protective coating is to be deposited by means of a PVD arc method to the component, and the main layer is to be flattened after the layer deposition by fine grinding and/or lapping and/or honing and/or polishing. Nevertheless, Maier does not disclose clear coating parameters for the deposition of the molybdenum nitride layer as a main layer. It is only mentioned that the main layer may have a nitrogen content of preferably 20-60 at %. However, a lower nitrogen content of 25-40 at % is preferred. In particular, a nitrogen content of 30-35 at % is most preferred. It is additionally noted that the hardness of the main layer is preferably between 1500 HV and 2200 HV, in order to ensure a particularly high mechanical stability of the component. Since Maier proposes a combination of low hardness and low nitrogen content for the main layer, it can reasonably be concluded that a molybdenum nitride layer containing at least essentially gamma phase ($\gamma$-Mo$_2$N) as a main layer is best suited for the coating of sliding elements.

Kazmanli et al. also report in *Surface and Coatings Technology* 167 (2003) 77-82 about the deposition of molybdenum nitride coatings by means of a PVD arc method, wherein molybdenum targets are evaporated in a reactive atmosphere of nitrogen. Kazmanli teaches in a manner similar to Ürgen that the formation of pure $\gamma$-Mo$_2$N is basically enhanced by using a low nitrogen pressure, for example of 0.8 Pa or 0.4 Pa, and the formation of pure $\delta$-MoN is enhanced by using a higher nitrogen pressure of for example 1.9 Pa. However, Kazmanli also reports about the formation of mixed gamma and delta phases by using a medium nitrogen pressure of for example 1.2 Pa or 1.5 Pa. Kazmanli furthermore teaches that the bias voltage and the substrate temperature during deposition of molybdenum nitride layers can play an important role. A high negative bias voltage of for example −250V to −350V should result in an increase of the energy of the Mo ions, which could enhance the formation of the gamma phase. A low negative bias voltage of for example −50V to −150V, however, should allow for the formation of the delta phase. Kazmanli additionally reports that molybdenum nitride layers which were deposited at a substrate temperature of 300° C. to 380° C. exhibited the formation of the delta phase whilst molybdenum nitride layers which were deposited at a higher substrate temperature of 410° C. to 510° C. exhibited the formation of a mixture of gamma and delta phase, wherein for the deposition of both variants a a nitrogen pressure of 1 Pa and a negative bias voltage of −150° V were used. The hardness values of the investigated molybdenum nitride layers were approximately 3372 HV for the gamma phase layers, approx. 5085 HV for the delta phase layers and approx. 4750 HV for the mixed gamma and delta-phase layers.

Hanbey Hazar in *Materials and Design* 31 (2010) 624-627 similarly reported on molybdenum nitride layers which were deposited on diesel engine parts by means of an Arc-PVD method and using a coating temperature of 300° C., a current of 125 A, a coating pressure of 0.4 Pa and a negative bias voltage of −100V. It is not specified whether only nitrogen gas or a gas containing nitrogen was introduced into the coating chamber during the coating process. Unlike Kazmanli, Hanbey Hazar reports about molybdenum nitride layers with delta phase but with a layer hardness of 2000 HV, which is much lower than that which was reported by Kazmanli.

DESCRIPTION OF THE TECHNICAL PROBLEM

According to the teaching of the documents cited above, the coating of sliding elements with molybdenum nitride layers which are deposited by means of arc PV, and the subsequent polishing of the coated surfaces are advantageous.

However, there is no clear indication as to whether to improve gliding properties, a molybdenum nitride layer with exclusively or mainly γ-Mo$_2$N, or a molybdenum nitride layer with exclusively or mainly δ-MoN, or a molybdenum nitride layer with both γ-Mo$_2$N and δ-MoN is most suitable.

At the same time, it is also not clear what hardness values for which phase are truly achievable and best suited.

Likewise, it is not clear which parameters should be used to deposit a predetermined combination of a certain phase or a certain mixture of phases of molybdenum nitride and a certain layer hardness.

Regarding the subsequent polishing of the surfaces coated with molybdenum nitride layers, it is not clear how a polishing process for the treatment of component surfaces can be used industrially. This mainly because the use of such methods in industrial production for the treatment of coated components with complex shapes, as for example piston pins and piston rings, is very expensive and complex.

For the use of a simple and cheaper process, which the brush method for example is, which would be well applicable for the treatment of components coated with molybdenum nitride in an industrial production environment, it would be desirable or necessary for the molybdenum nitride layers to be easy to brush and that they should tend rather to have a reduced hardness, which is preferably not higher than 3700 HV.

Again, however, is not desirable for many tribological applications to have a coating hardness that is too low. Therefore, the hardness of the molybdenum nitride layers should possibly be equal to or preferably greater than 2600 HV.

OBJECT OF THE PRESENT INVENTION

It is an object of the present invention to provide a molybdenum nitride layer and a method for its preparation, wherein the layer has very good sliding properties and at the same time a "reasonable" coating hardness which is preferably not lower than 2600 HV and not greater than 3700 HV.

It is a further object of the present invention to provide an economical process for the post-treatment of molybdenum nitride layers.

DESCRIPTION OF THE PRESENT INVENTION

The object of the present invention is achieved by providing a coating as in claim 1, a coating method as in claim 13, and a brushing process for the post-treatment of the coated surfaces as provided in claim 15.

The present invention relates to a coating comprising at least one Mo—N based hard material layer, which at least largely comprises the hexagonal phase of the molybdenum nitride δ-MoN, wherein the intensity ratio of the two peaks (δ-MoN 220)/(δ-MoN 200) is ≥3, preferably ≥10, more preferably ≥30.

The inventive Mo—N based hard material layer is preferably deposited as the uppermost layer of the coating.

In certain applications, it has been found that it may be advantageous if the coating includes only one or more Mo—N based hard material coatings. However, the hard material layer system may also include layers of other materials which may serve, for example, as adhesive layers or support layers, or as other types of layers.

According to a preferred embodiment of the present invention, the Mo—N based hard material layer preferably consists essentially of molybdenum nitride.

According to a another preferred embodiment of the present invention, the Mo—N based hard material coating has a Vickers hardness between 2600 HV and 3700 HV or an indentation hardness $H_{IT}$ between 27 GPa and 38 GPa.

According to a further preferred embodiment of the present invention, the Mo—N based hard material coating has residual stresses resp. compressive stresses between −1 Pa and −9 Pa.

Preferably, the residual stresses are between −2 Pa and −8 Pa.

According to yet another preferred embodiment of the present invention, the surface of the Mo—N based hard material coating is subsequently treated by means of a brushing process.

Preferably, the Mo—N based hard material coating thus post-treated has a surface roughness that is characterized by Rpkx<Rvkc.

A coating according to the present invention is preferably produced by means of PVD techniques.

Preferably, at least the Mo—N based layer of a coating according to the present invention is deposited on a substrate surface in a vacuum coating chamber by means of arc evaporation of at least one target comprising at least largely molybdenum in an atmosphere containing at least largely nitrogen gas, wherein the coating temperature during at least most of the deposition time of the Mo—N based hard material layer is maintained under 300° C.

The coating temperature during the deposition of the Mo—N based hard material layer is preferably ≤280° C., more preferably ≤250° C., even more preferably ≤225° C.

In the frame of the present invention, the term coating temperature is to be understood as the the temperature of the substrates to be coated during the deposition of the Mo—N based hard material layer.

Preferably, during at least during most of deposition time of the Mo—N based hard material coating, if possible only nitrogen gas is admitted into the coating chamber. Minimal amounts of other gases (e.g. minimal amounts of argon or krypton or oxygen or carbon or hydrogen, etc.) should in principle not a problem for the production of the inventive layers.

Preferably, during at least during most of deposition time of the Mo—N based hard material coating, a negative bias voltage is applied onto the substrate to be coated.

Preferably, for the deposition of the Mo—N based hard material layer, only targets are used that consist essentially of molybdenum Surprisingly, the process parameter window as regards the selection of process parameters such as nitrogen pressure and bias voltage for the deposition of the inventive Mo—N based hard material coatings is significantly large when using a coating method according to the present invention.

BRIEF DESCRIPTION OF THE DRAWINGS

The invention will be described in more detail on the basis of the following figures and examples.

DETAILED DESCRIPTION

Figure 8:
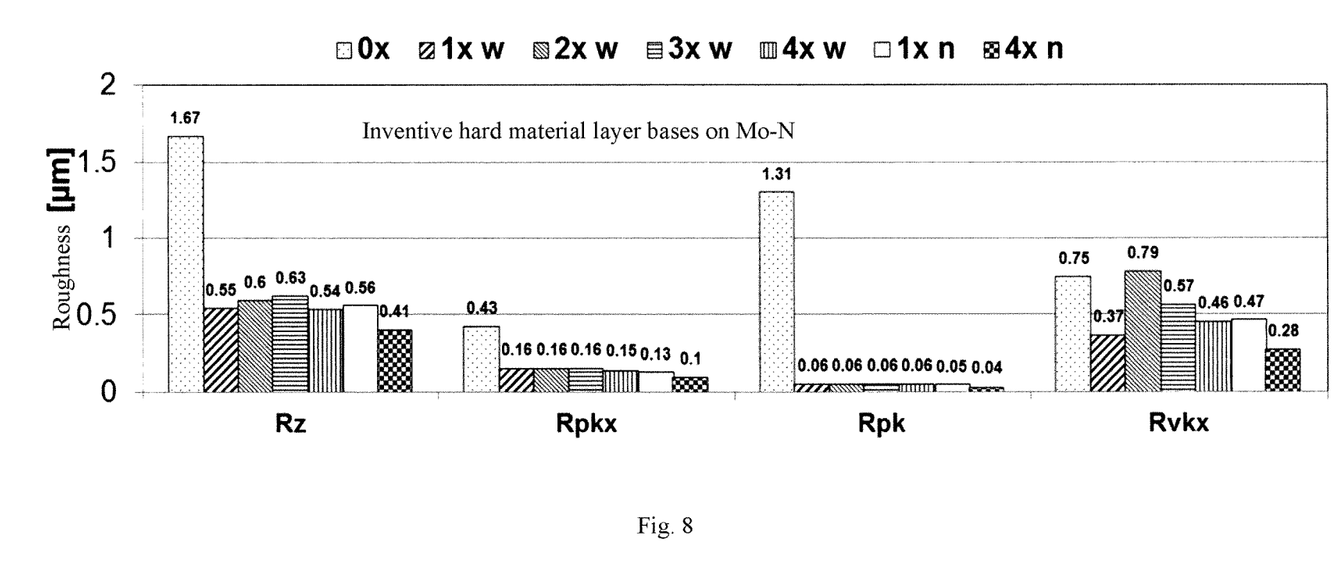
FIG. 8 shows the roughness Rz, Rpkx, Rpk and Rvkx of inventively-produced Mo—N based hard material coatings whose surface has been treated differently using a brushing method.
Figure 9A:
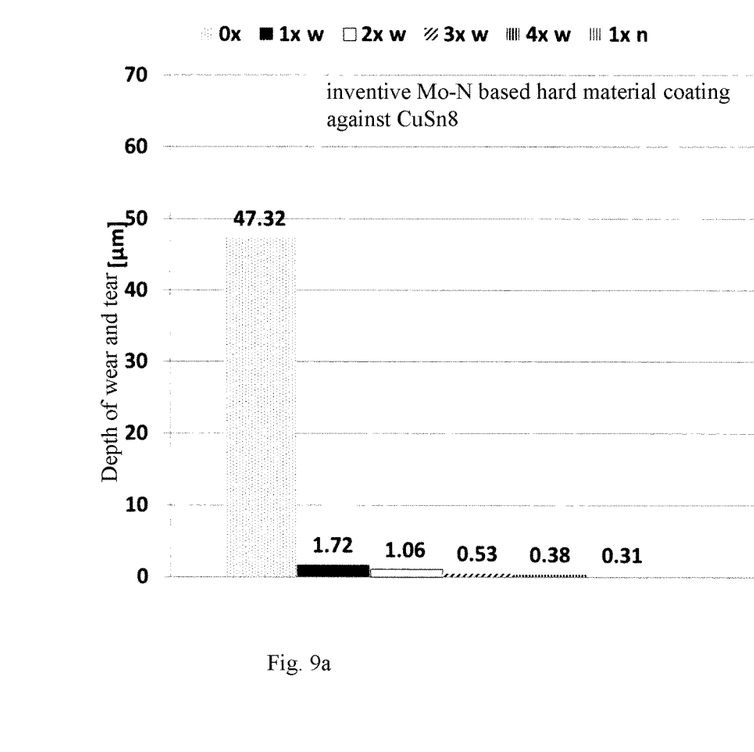
FIG. 9a shows the results of tests in which the piston pins were coated with Mo–N layers.
Figure 9B:
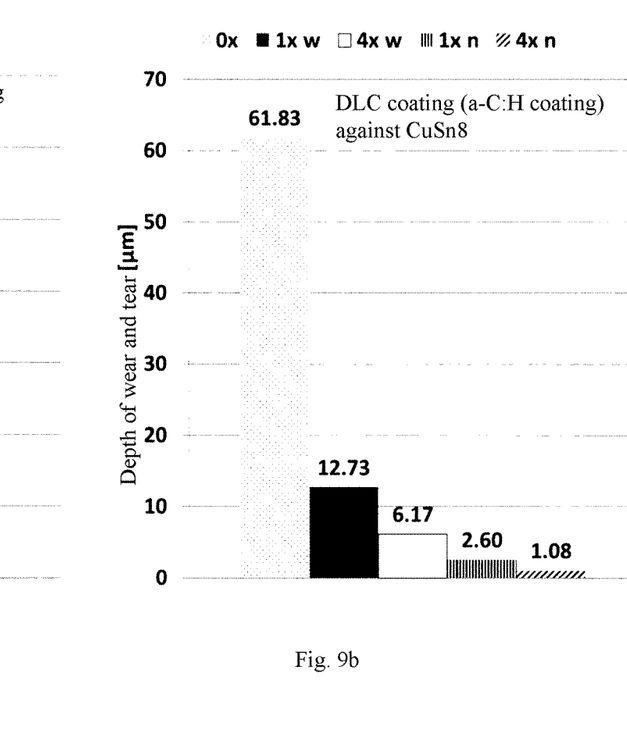
FIG. 9b shows the results for the same tests, but where the piston pins were coated with DLC coatings of the type a-C:H.

FIG. 9 shows the wear and tear of the counter body, which was tested with the coated piston pin. The tests were carried out both with the piston pin not post-treated after coating (Ox) and with the piston pin post-treated after coating. FIG. 9a shows the results of tests in which the piston pins were coated with Mo—N layers. FIG. 9b shows the results for the same tests, but where the piston pins were coated with DLC coatings of the type a-C:H. For both tests described in FIG. 8 and in FIG. 9, the components coated respectively with Mo—N(FIGS. 8 and 9a) and with DLC (FIG. 9b) were subjected to the following post-treatment:
  Ox: no treatment,
  1× w: 1 time weak brushing treatment,
  2× w: 2 times weak brushing treatment,
  3× w: 3 times weak brushing treatment,
  4× w: 4 times weak brushing treatment,
  1× n: 1 time powerful brushing treatment,
  4× n: 4 times powerful brushing treatment.

In the frame of the present invention, when reference is made to the formation of the gamma phase of molybdenum nitride ($\gamma$-Mo$_2$N), this should rather be understood as the formation of a cubic phase of the molybdenum nitride, i.e. the formation of the gamma or the zeta phase or even the formation of a mixture of the two cubic phases both gamma as well as zeta.

The zeta phase ($\zeta$-MoN) is also a cubic phase of the molybdenum nitride like the gamma phase, but which in comparison with the gamma phase ($\gamma$-Mo$_2$N) comprises more nitrogen. The nitrogen content in the zeta phase can even go into the super-stoichiometric range (more N than Mo). In XRD diffraction patterns, the gamma phase can hardly be distinguished from the zeta phase, because these two phases, as mentioned above, are cubic. Therefore, the formation of these two phases can be detected accurately only if, for example, a detailed analysis of the chemical composition is made. However, if multiple phases are present in the layer, an accurate determination of the gamma or zeta phase is very difficult. That's why in the present description of the invention, many mentions were made $\gamma$-Mo$_2$N, whereas it could just as well be the $\zeta$-MoN. Since the currently existing references from the literature with respect to XRD diffraction patterns of cubic phases of molybdenum nitride always use the term $\gamma$-phase, reference is made in the present invention to the gamma phase and not simply to a cubic phase of molybdenum nitride, although it also is may be the zeta phase.

Figure 1:
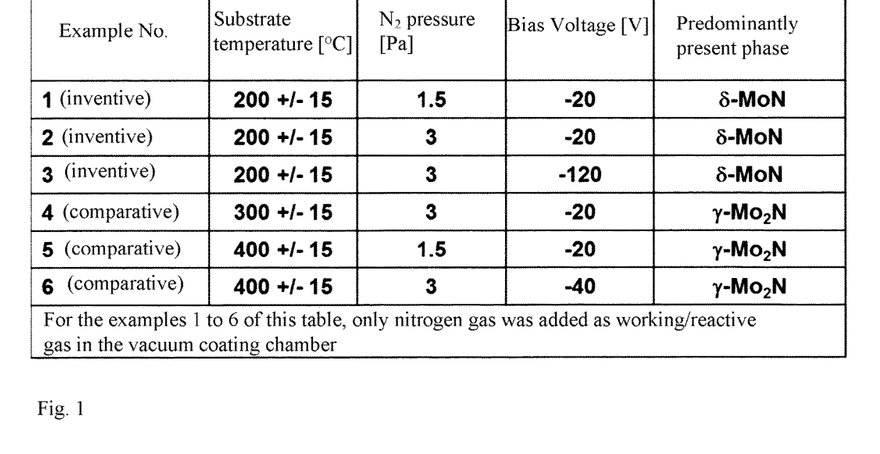
FIG. 1 shows the coating parameters used for the deposition of the inventive and non-inventive Mo—N based layers, wherein the inventive layers comprise at least largely the delta phase of molybdenum nitride.
Figure 2:
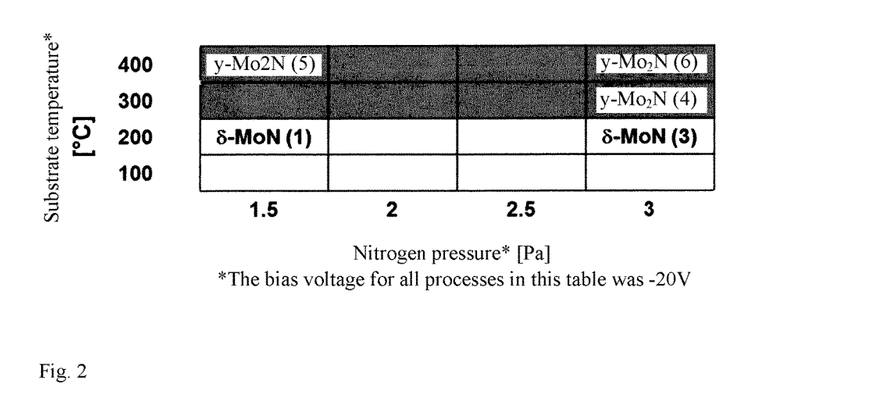
FIG. 2 shows the influence of the coating temperature and of the nitrogen pressure on the formation of the hexagonal delta and the cubic gamma phase of the molybdenum nitride at a constant bias voltage (in the context of the present invention, in particular in FIG. 2, the zeta phase or a mixture of gamma and zeta phase are also meant when talking about the gamma phase).
Figure 3:
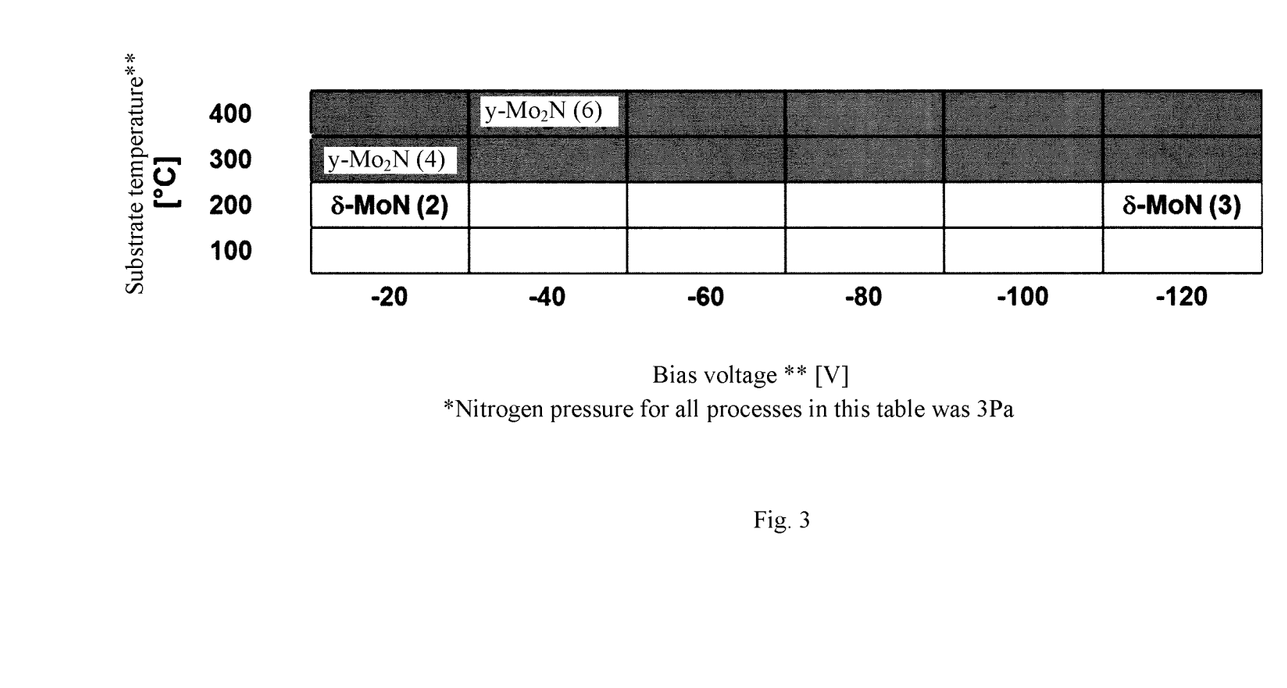
FIG. 3 shows the influence of the coating temperature and of the bias voltage on the formation of delta and gamma phase of the molybdenum nitride at constant nitrogen pressure (in the context of the present invention, in particular in FIG. 3, the zeta phase or a mixture of gamma and zeta phase are also meant when talking about the gamma phase).

FIG. 1 shows a table with a few selected examples of deposition processes, in which in examples 1 to 3 inventive Mo—N hard material layers were deposited and in examples 4 to 6 non-inventive Mo—N hard material layers were deposited.

For the XRD investigations in the context of the present invention, the following equipment and measurement programs were used:

XRD Device:
  copper anode,
  generator voltage: 40 kV
  generator current: 30 mA
  1 or 0.2 mm slit (0.2 mm was only in the case of example 2, because of the measurement with a slit of 1 mm, the signal went into saturation).

Measuring Program Theta 2 Theta (T2T):
  T2T range: 20-80°
  increment: 0.02°
  time/step: 1 second Measuring Program Glancing Incidence (Gl):
  incidence: 2°
  T2T range: 20-80°
  increment: 0.02°
  time/step: 1 second For the examples and analyses, specimens from high-speed steel 1.2842 90MnCrV8 and sliding elements made of various high-speed steels, as well as standard piston pins (for the experiments with coated and subsequently brushed piston pin surfaces) were coated in an arc facility of the company Oerlikon Balzers Coating AG. In all examples, molybdenum targets were evaporated by means of arc PVD in a nitrogen atmosphere. The process pressure resp. the nitrogen pressure was maintained constant by controlling the flow of nitrogen gas in the coating chamber. A bias voltage was applied to the substrates to be coated. The same arc coating sources and arc current values were used for all processes. Only the coating temperature, the nitrogen pressure and the bias voltage were varied according to the information in FIG. 1.

Figure 4:
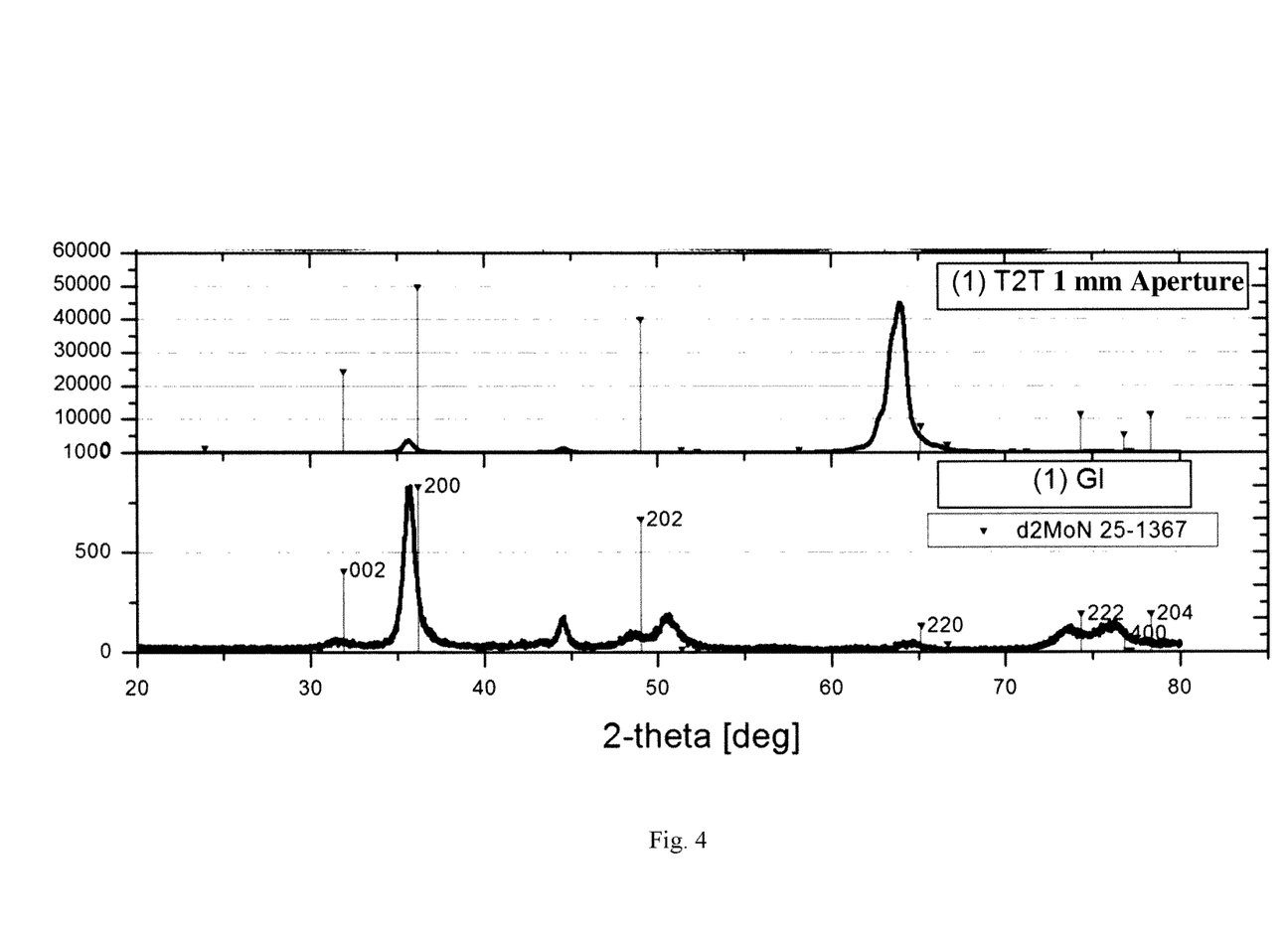
FIG. 4 shows the XRD diffraction patterns (T2T with aperture at 1 mm and Gl) of the Mo—N layer that was deposited according to the inventive example 1.
Figure 5:
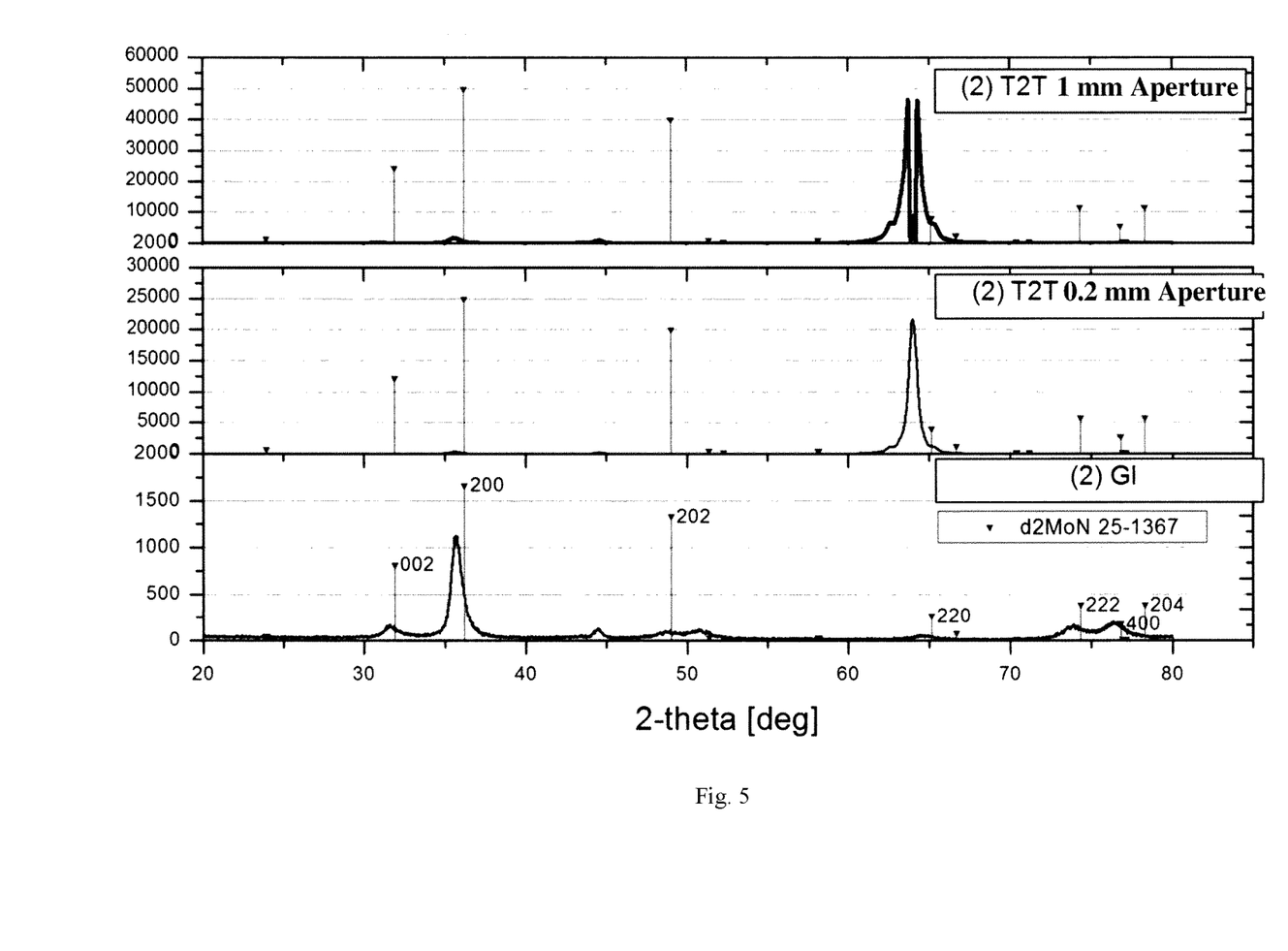
FIG. 5 shows the XRD diffraction patterns (T2T with aperture at 1 mm and 0.2 mm and Gl) of the Mo—N layer that was deposited according to the inventive Example 2.
Figure 6:
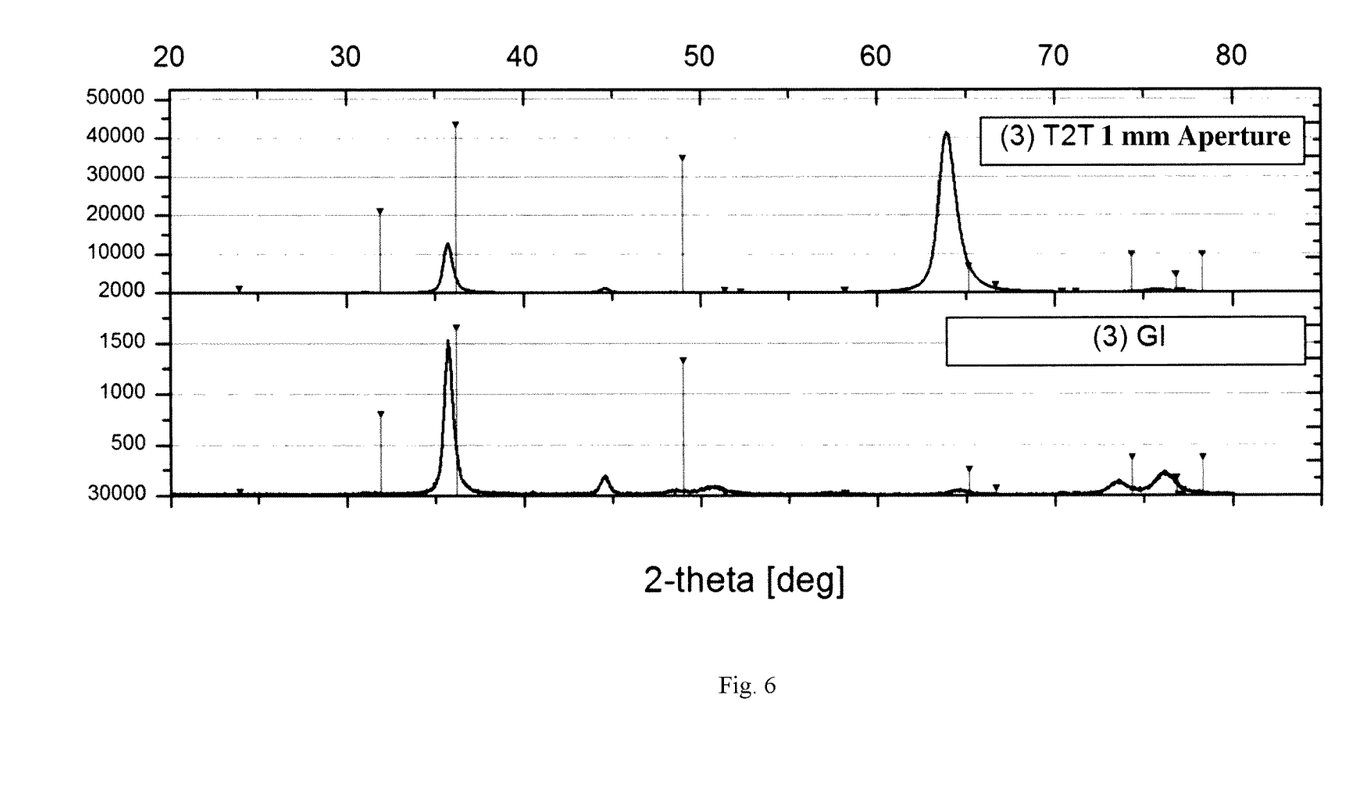
FIG. 6 shows the XRD diffraction patterns (T2T with aperture at 1 mm and Gl) of the Mo—N layer that was deposited according to the inventive example 3.

The Mo—N based hard material coatings produced in examples 1, 2 and 3, which were deposited according to the invention using a coating temperature of 200° C.+/−15° C., comprise at least for the most part the delta phase of molybdenum nitride. Even if a low $N_2$ pressure of 1.5 Pa (as indicated in FIG. 1, example 1) or a high negative bias voltage of −120 V (as indicated in FIG. 1, example 3) was used, the formation of the delta phase of molybdenum nitride could be determined, as can be seen from the corresponding XRD diffraction patterns shown in FIGS. 4, 5 and 6.

Figure 7:
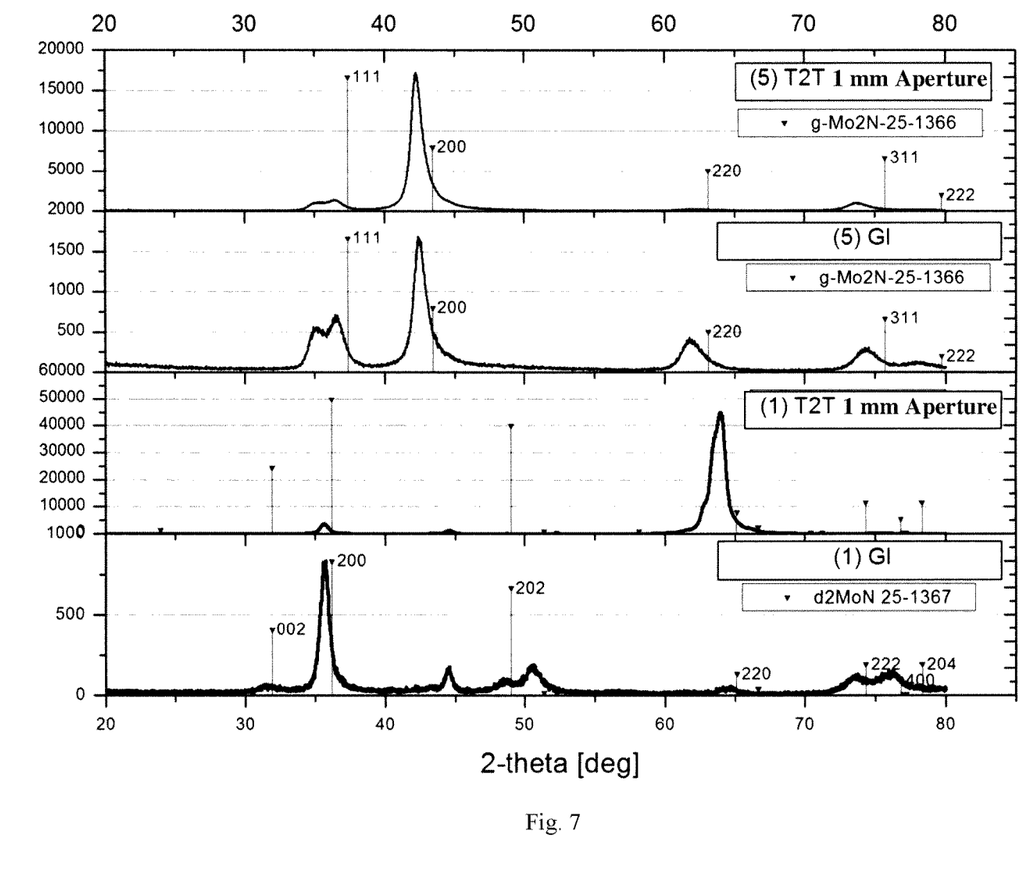
FIG. 7 shows both the XRD diffraction patterns (T2T with aperture at 1 mm and Gl) of the Mo—N layer deposited according to the inventive example 1 (below), and the XRD diffraction patterns (T2T with aperture at 1 mm and Gl) of Mo—N layer deposited according to the non-inventive example 5 (above).

On the other hand, the XRD diffraction patterns of the layers produced according to examples 4, 5 and 6, in which a coating temperature of 300° C. or higher was used, show a cubic structure which indicates the formation of the gamma and/or zeta phase of molybdenum nitride (see XRD diffraction patterns of a Mo—N based layer according to example 5 (5) in FIG. 7).

In FIG. 7, the difference between the two illustrated XRD diffraction patterns of the inventive Mo—N based hard material coating (example 1 (1)) respectively of a non-inventive Mo—N based hard material coating (example 5 (5)) can be seen.

The coating temperature for the deposition of a Mo—N based hard material coating according to the present invention is at least 50° C., more preferably at least 100° C., most preferably at least 150° C.

Furthermore, the inventors have found that by using a coating temperature not higher than 200° C.+/−50° C. even Mo—N layers can be produced according to the invention if a nitrogen pressure of less than 1.5 Pa, or more than 6 Pa and/or a negative bias voltage is lower (in absolute value) than −20 V or greater (in absolute value) than −120V is used.

Further details of embodiments or preferred embodiments of the present invention:

According to the invention a bias voltage of −10V to −150V is preferably used.

According to the invention a nitrogen pressure of 1 Pa to 6 Pa is preferably used.

As already mentioned above, the inventively produced Mo—N layers exhibit the characteristic hexagonal structure of the delta phase of molybdenum nitride. At the same time, the layers produced according to the invention exhibit a Vickers hardness between 2600 HV and 3700 HV or an indentation hardness $H_{IT}$ between 26-27 GPa and 37-38 GPa.

According to a preferred embodiment of a coating with at least one Mo—N layer according to the present invention, the inventive Mo—N layers have an e-modulus between 300 GPa and 500 GPa, preferably between 330 and 470 GPa, more preferably between 350 and 450 GPa.

According to another preferred embodiment of a coating according to the present invention, the inventive Mo—N layers exhibit residual compressive stresses of −1 GPa to −9 GPa, preferably of −2 GPa to −8 GPa.

According to yet another preferred embodiment of a coating according to the present invention, the inventive Mo—N layers a indentation hardness $H_{IT}$ greater than 28 GPa and lower than 37 GPa.

During tribological tests, the inventors have found that inventive Mo—N layers with a Vickers hardness of 3000 HV to 3600 HV or an indentation hardness $H_{IT}$ between 30 GPa and 36 GPa are particularly well suited for certain applications.

Particularly outstanding gliding properties were found for example in the inventive Mo—N layers which had a $H_{IT}$ hardness of 34 GPa to 35 GPa, a yield point of 31 GPa to 32 GPa and an e-modulus of 350 GPa to 450 GPa.

As mentioned above, the Mo—N layers are preferably treated by means of a brushing process in order to achieve a good surface finish suitable resp. surface roughness, which is especially important for tribological applications in which good gliding properties are required.

The increase in roughness in/on layers which are produced by means of cathodic arc vaporization (arc evaporation or arc PVD), is very marked due to the occurrence of macro-particles (droplets or spatters) from the cathode (target). A post-treatment, for example by polishing or brushing or micro-beams, does not produce a significant reduction in roughness in all layers produced by cathodic arc evaporation. This is because the integration of spatters in the layer occurs at different degrees of stability and because for this reason the layers let themselves be post-treated more or less well.

In the case of the inventive Mo—N based hard material coatings, the post-treatment by brushing works very well however.

This is illustrated in FIG. 8, in which the roughness of inventive Mo—N based hard material coatings of about the same thickness (also simply called Mo—N layers or inventive Mo—N layers in the context of the present invention) are compared before and after different post-treatments by brushing.

In FIG. 9a, the counter body wear and tear of a CuSn8 pin is shown when running against an inventively coated piston pin. In comparison thereto, the wear and tear curve for a DLC-coated piston pin in FIG. 9b is shown. In both cases, the various previously described brushing methods were weak (w) and strong (s), used as single or as multiple brushing. It is absolutely surprising then that using the same treatment, the inventive Mo—N layers exhibited less than wear and tear of the counter body than the DLC layers post-treated accordingly. This is also surprising because the initial roughness of the Mo—N layers due to the spatters (droplets) is higher than that of the DLC layers. This shows how effective these spatters can be removed using the industrial brushing proposed here according to the invention. The inventors have found that particularly for achieving lower Rpkx values with Mo—N, less strong brushing settings were required, making the post-treatment process easier and more easily reproducible. In summary, it can be said that the inventive Mo—N layers can be easily post-treated and that this results in a significant reduction of the characteristic values for peak roughness Rpk, Rpkx.

The high Rvkx value compared to the Rpkx value enhances the formation of oil lubrication pockets that ensure good lubrication especially with small amounts of oil.

In order to achieve low wear and tear of the counter body, a Rpkx<0.3 μm, preferably <0.2 μm, more preferably <0.15 μm is sought.

According to a particularly preferred embodiment of the present invention, the Mo—N layers have a nitrogen content of 45 at % to 55 at %.

The measured ratio in atomic % between nitrogen and molybdenum content in the inventive layers which during operation of molybdenum targets as cathodes in an arc PVD process using an arc current of 220 A, a coating temperature (=substrate temperature) of 200° C., a negative bias voltage of −20V and a nitrogen pressure of 3 Pa, was nearly 50:50.

According to a further embodiment of the present invention, an adhesive layer deposited as an interface between the substrate to be coated and the molybdenum nitride layer. As the adhesive layer in this context, Cr and/or CrN are particularly well suited layers, preferably with a thickness of less than 60 nm, depending on the application particularly preferably between 10 nm and 50 nm.

According to a highly preferred embodiment of a method according to the present invention, the inventively produced Mo—N hard material layer is deposited as the outermost layer of the coating by means of arc evaporation of molybdenum targets in a nitrogen atmosphere and subsequently post-treated by means of a brushing method until a surface roughness with Rpkx<Rvkx is achieved.

What is claimed is:

1. Coating comprising at least one hard material layer comprising Mo—N, which at least largely comprises the hexagonal phase of molybdenum nitride δ-MoN, characterized in that the intensity ratio of the two peaks (δ-MoN 220)/(δ-MoN 200) in an XRD diffraction pattern is >3.

2. Coating according to claim 1, characterized in that the at least one hard material layer consists essentially of molybdenum nitride.

3. Coating according to claim 1, characterized in that the intensity ratio of the two peaks (δ-MoN 220)/(δ-MoN 200) is >10.

4. Coating according to claim 3, characterized in that the intensity ratio of the two peaks (δ-MoN 220)/(δ-MoN 200) is >30.

5. Coating according to claim 1, characterized in that the at least one hard material coating has a Vickers hardness between 2600 HV and 3700 HV or a $H_{IT}$ hardness of 27-38 GPa.

6. Coating according to claim 5, characterized in that the $H_{IT}$ hardness is greater than 28 GPa and less than 38 GPa.

7. Coating according to claim 1, characterized in that the at least one hard material layer has residual compressive stresses that are in the range between −1 GPa and −9 GPa.

8. Coating according to claim 7, characterized in that the residual compressive stresses are in the range between −2 GPa and −8 GPa.

9. Coating according to claim 1, characterized in that the at least one hard material layer has an e-modulus between 300 GPa and 500 GPa.

10. Coating according to claim 1, characterized in that the at least one hard material layer is deposited as the outermost layer of the coating and at least one area of the layer surface has a surface roughness satisfying the condition Rpkx<Rvkx.

11. Coating according to claim 10, characterized in that at the least one area of the layer surface has a surface parameter Rpkx<0.3 µm.

12. Method for producing a coating according to claim 10, wherein a predetermined surface roughness of Rpkx<Rvkx at the outermost hard material coating is achieved with the aid of a brushing process, in that the brushing process is used for the post-treatment of the outermost hard material coating previously deposited.

13. Substrate having a coating according to claim 1.

14. Coated substrate according to claim 13, characterized in that there is at least one intermediate layer between the substrate surface.

15. Method for depositing a coating according to claim 1, characterized in that at least one hard material coating is deposited by means of an arc PVD process onto a substrate surface to be coated, wherein at least one target comprising at least largely molybdenum is arc evaporated in an atmosphere containing at least largely nitrogen gas, and during at least most of the deposition time of the at least one hard material layer, a coating temperature below 300° C. is used.

16. Method according to claim 15, characterized in that at least during most of the deposition time of the molybdenum nitride layer a negative bias voltage is applied onto the substrate to be coated.

17. Method according to claim 15, characterized in that at least during the full deposition time of the molybdenum nitride layer a negative bias voltage is applied onto the substrate to be coated.

18. Coating according to claim 1, characterized in that the at least one hard material layer has an e-modulus between 350 GPa and 450 GPa.

19. Method for depositing a coating according to claim 1, characterized in that at least the at least one hard material coating is deposited by means of an arc PVD process onto a substrate surface to be coated, wherein at least one target comprising at least largely molybdenum is arc evaporated in an atmosphere containing at least largely nitrogen gas, and during at least most of the deposition time of the at least one hard material coating, a coating temperature below 200° C.+/−50° C. is used.

20. A sliding member having a coating according to claim 1, characterized in that there is at least one intermediate layer between the substrate surface and the at least one hard material coating that comprises chromium nitride comprises or consists of chromium nitride.

* * * * *